(12) United States Patent
Hong et al.

(10) Patent No.: US 6,802,949 B2
(45) Date of Patent: Oct. 12, 2004

(54) METHOD FOR MANUFACTURING HALF-METALLIC MAGNETIC OXIDE AND PLASMA SPUTTERING APPARATUS USED IN THE SAME

(75) Inventors: Jin Pyo Hong, Seoul (KR); Chang Hyo Lee, Seoul (KR); Chae Ok Kim, Kyungki-do (KR); Kap Soo Yoon, Seoul (KR); Sung Bok Lee, Seoul (KR)

(73) Assignee: Hanyang Hak Won Co., Ltd., Seoul (KR)

( * ) Notice: Subject to any disclaimer, the term of this patent is extended or adjusted under 35 U.S.C. 154(b) by 0 days.

(21) Appl. No.: 10/269,865

(22) Filed: Oct. 15, 2002

(65) Prior Publication Data

US 2003/0070914 A1 Apr. 17, 2003

(30) Foreign Application Priority Data

Oct. 15, 2001 (KR) ........................................ 2001-63371
Sep. 30, 2002 (KR) ................................. 10-2002-0059433

(51) Int. Cl.$^7$ ............................................. C23C 14/35
(52) U.S. Cl. ........................... 204/298.16; 204/192.12; 204/192.2; 204/192.22; 204/298.28; 204/298.11; 204/298.06
(58) Field of Search ........................ 204/192.12, 192.2, 204/192.22, 298.28, 298.06, 298.11, 298.16

(56) References Cited

U.S. PATENT DOCUMENTS

| | | | | |
|---|---|---|---|---|
| 5,380,414 A | * | 1/1995 | Tepman | 204/192.3 |
| 2001/0022019 A1 | * | 9/2001 | Ahn et al. | 29/604 |
| 2003/0146084 A1 | * | 8/2003 | Fu | 204/192.2 |

* cited by examiner

Primary Examiner—Steven Versteeg
(74) Attorney, Agent, or Firm—Webb Ziesenheim Logsdon Orkin & Hanson, P.C.

(57) ABSTRACT

Disclosed are a method for manufacturing a half-metallic magnetic oxide and a plasma sputtering apparatus used in the method. A conductor provided with at least one hole is disposed between a metal target and a substrate holder in the plasma sputtering apparatus, thereby improving the bonding of metal ions discharged from the metal target to oxygen ions, and a magnetic field with a coercive force larger than that of a thin film to be formed on the substrate, thereby obtaining a magnetic oxide film with excellent properties. In a preferred embodiment of the present invention, a conductor-side power supply unit is connected to the conductor, thereby additionally supplying power to the conductor and generating second plasma. The plasma sputtering apparatus supplies high power so as to decompose oxygen, and discharges metal ions with different electrovalences at a precise ratio by the additional power supply, thereby being effectively used in manufacturing a half-metallic oxide at low temperatures.

18 Claims, 10 Drawing Sheets

METHOD FOR MANUFACTURING HALF-METALLIC MAGNETIC OXIDE AND PLASMA SPUTTERING APPARATUS USED IN THE SAME

BACKGROUND OF THE INVENTION

1. Field of the Invention

The present invention relates to a method for manufacturing a half-metallic magnetic oxide, and more particularly to a method for manufacturing a half-metallic magnetic oxide such as $Fe_3O_4$ by forming a magnetic field on a substrate and supplying additional RF (Radio Frequency) power thereto and a plasma sputtering reactor used in the method.

2. Description of the Related Art

Generally, half-metallic ferromagnetic oxides have an energy gap to a minority spin band but do not have an energy gap to a majority spin band in Fermi energy level. The formation of the spin-dependent energy gap causes the ferromagnetic oxides to have 100% spin-polarization. These half-metallic substances have very large reluctance in a device having a spin-tunneling structure.

Therefore, since the half-metallic ferromagnetic oxides are used as magnetic recording media, and much research on half-metallic ferromagnetic oxides has been recently carried out. Particularly, the half-metallic ferromagnetic oxides are spotlighted as substances applied to various high-speed and high frequency devices such as magnetic random access memory (MRAM) devices, magnetic sensors, next generation spin devices, etc.

$Fe_3O_4$, as a representative half-metallic ferromagnetic oxide, has an inverse spinel structure. The inverse spinel structure is obtained by adding $Fe^{3+}$ ions on a tetrahedral coordinate and adding $Fe^{2+}$ and $Fe^{3+}$ ions on an octahedral coordinate on a face center cubic structure made of oxygen. Specifically, the composition of Fe ions is precisely in the ratio of $Fe^{3+}:Fe^{2+}=2:1$. Since minority spin electrons hop between $Fe^{3+}$ and $Fe^{2+}$ ions, $Fe_3O_4$ is excellent in conductivity. The hopping minority spin electrons represent a metal-insulator transition due to a hopping electron frozen effect at Verwey temperature of approximately 125K. Therefore, $Fe_3O_4$ has state density in Fermi level at room temperature, even if the state density is very low.

In order to manufacture a thin film made of $Fe_3O_4$ being one of the half-metallic magnetic oxides, $Fe^{2+}$ and $Fe^{3+}$ ions having different electrovalences must be generated from Fe and the ratio of $Fe^{2+}$ and $Fe^{3+}$ ions must be precisely controlled. Further, in order to carry out the above-described deposition process, high power is required to decompose oxygen molecules.

Therefore, the same substance must be decomposed into ions with different electrovalences in the precise ratio in the method for manufacturing the half-metallic magnetic oxide, and high power to decompose the substance is required. As a result, the conventional method for manufacturing the half-metallic magnetic oxide cannot be practically used.

Conventionally, a molecular beam epitaxy (MBE) apparatus and a pulsed laser deposition (PLD) apparatus are used to manufacture half-metallic magnetic oxides. The MBE apparatus has the advantage of precisely controlling the composition ratio. On the other hand, the PLD apparatus has the advantage of using high power in depositing a thin film, thereby being suitably used in a method for manufacturing Fe oxides. Although the MBE process using the MBE apparatus achieves a precise composition ratio, since the MBE apparatus is very expensive, it is difficult to practically use the MBE process. On the other hand, the PLD process using the PLD apparatus cannot use a Fe target, but uses a high-priced $Fe_3O_4$ target comprising ions with different equivalences in the desired composition ratio. Further, a magnetic body grown by the PLD process has an antiferromagnetic phase formed therein, thereby not obtaining magnetic saturation.

In the aforementioned conventional processes, magnetic properties of the grown magnetic body may be depreciated by heat energy additionally applied in order to raise the temperature of a substrate. This causes a serious problem of loss of magnetic properties of other magnetic materials, when a multi-layered device is manufactured by stacking the $Fe_3O_4$ thin film and other magnetic substances.

As described above, in order to manufacture a half-metallic oxide thin film, there is required a high-priced facility. Further, with the conventional processes, it is difficult to grow a magnetic thin film having excellent magnetic properties. Therefore, the aforementioned conventional processes cannot be practically used in industrial applications.

Therefore, a new method for manufacturing a half-metallic oxide such as $Fe_3O_4$ having excellent magnetic properties using a conventional thin film formation apparatus is required.

SUMMARY OF THE INVENTION

Therefore, the present invention has been made in view of the above problems, and it is an object of the present invention to provide a method for manufacturing a half-metallic magnetic oxide using a conventional sputtering apparatus, which improves oxygen decomposition and properly controls the composition ratio of metal ions and oxygen ions, thereby providing a half-metallic magnetic oxide having excellent magnetic properties.

In accordance with one aspect of the present invention, the above and other objects can be accomplished by the provision of a method for manufacturing a half-metallic magnetic oxide thin film on a substrate using a plasma sputtering apparatus provided with a substrate holder for supporting the substrate, a metal target being opposite to the substrate holder, a gas injection inlet for supplying oxygen gas into a reaction chamber, and a power supply unit for applying a voltage to the reaction chamber using the target and the substrate holder as both electrodes, comprising the steps of:

disposing a conductor provided with at least one hole between the substrate holder and the metal target;

forming a magnetic field at an area where a thin film is formed on the substrate, said magnetic field having a coercive force larger than that of the thin film to be formed;

injecting oxygen gas into the reaction chamber;

applying a designated voltage to the reaction chamber so as to form a sputtering condition; and forming a half-metallic magnetic oxide thin film on the substrate by bonding ions discharged from the metal target to oxygen ions decomposed from the oxygen gas under the sputtering condition of the reaction chamber.

Preferably, the metal target may be made of iron (Fe), and the half-metallic magnetic oxide thin film formed on the substrate may be a $Fe_3O_4$ thin film. Further, the conductor may be ring-shaped. Alternatively, the conductor may be formed as a mesh including a plurality of holes arranged thereon.

Further, preferably, the magnetic field formed on the substrate may have a strength of more than 100 Oe, and more preferably, have a strength between 100 Oe and 2 kOe.

Preferably, the flow rate of oxygen gas injected into the reaction chamber may be controlled in the range of approximately 0.1 sccm to 10 sccm. If necessary, designated activation gas may be injected into the reaction chamber. Preferably, the activation gas may be Argon (Ar) gas.

Preferably, the flow rate of Argon (Ar) gas injected into the reaction chamber may be controlled in the range of approximately 10 sccm to 50 sccm.

Further, preferably, in order to obtain a magnetic thin film having more excellent magnetic properties, a designated RF voltage may be applied to the conductor.

Moreover, preferably, the substrate on which the magnetic thin film is formed may be heated to a designated temperature. In order not to degrade the magnetic properties of the thin film to be formed, the temperature of the heated substrate may be preferably maintained at approximately 100° C. to 400° C.

In accordance with another aspect of the present invention, there is provided a plasma sputtering apparatus comprising: a reaction chamber; a substrate holder formed on a side of the reaction chamber and serving to dispose a substrate thereon; a gas injection inlet for supplying reaction gas into the reaction chamber; a target being opposite to the substrate and serving to discharge its particles by the designated sputtering in the reaction chamber; a power supply unit for supplying power for generating discharge between the substrate holder and the target; a conductor disposed between the target and the substrate holder and provided with at least one hole for allowing the particles discharged from the target to proceed to the substrate; and magnetic formation means for forming a magnetic field on the substrate disposed on the substrate holder, the magnetic field having a coercive force larger than that of a thin film to be formed on the substrate.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

Figure 1:
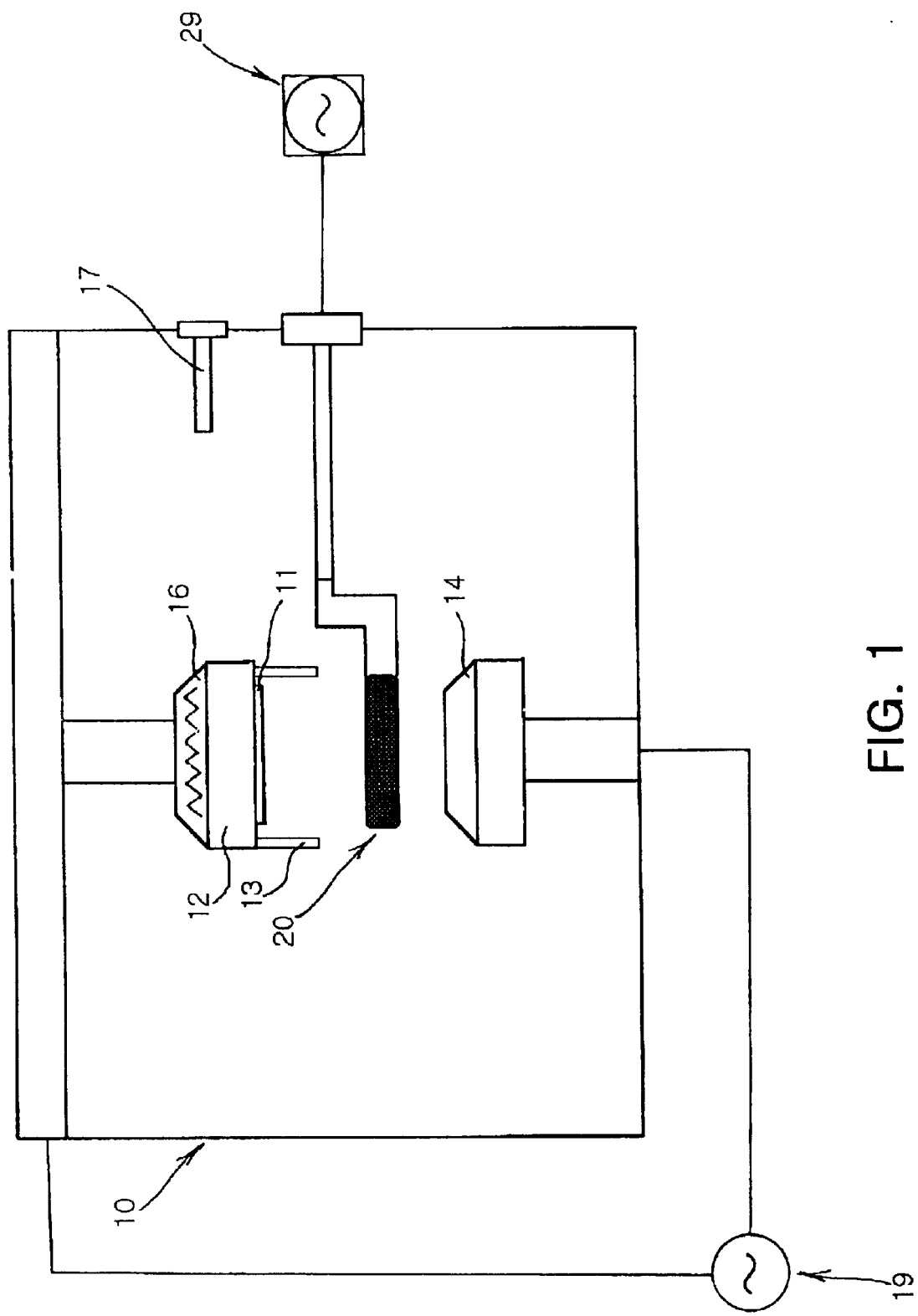
FIG. 1 is a schematic cross-sectional view of a plasma sputtering apparatus used in the present invention.

FIG. 1 is a schematic cross-sectional view of a plasma sputtering apparatus in accordance with an embodiment of the present invention.

With reference to FIG. 1, the plasma sputtering apparatus comprises a substrate holder 12 for disposing a substrate 11 within a reaction chamber 10, and a target 14 being opposite to the substrate holder 12. The plasma sputtering apparatus further comprises a gas injection inlet 17 for injecting reaction gas or activation gas into the reaction chamber 10 and a power supply unit 19 for supplying power so as to induce discharge between the substrate holder 12 and the target 14.

The power supply unit 19 is connected to one end of the target 14 and applies power via a cathode (not shown) serving as a sputtering gun, thereby discharging ions from the target 14 to the substrate 11. Herein, the ions discharged from the target 14 are bonded to the reaction gas injected via the gas injection inlet 17, thereby being formed as a thin film made of a desired material on the substrate 11.

Specifically, a designated conductor 20 is further disposed between the target 14 and the substrate holder 12. The conductor 20 includes at least one hole formed therein so that the ions discharged from the target 14 are deposited on the substrate 11 via the hole of the conductor 20.

Figure 2A:
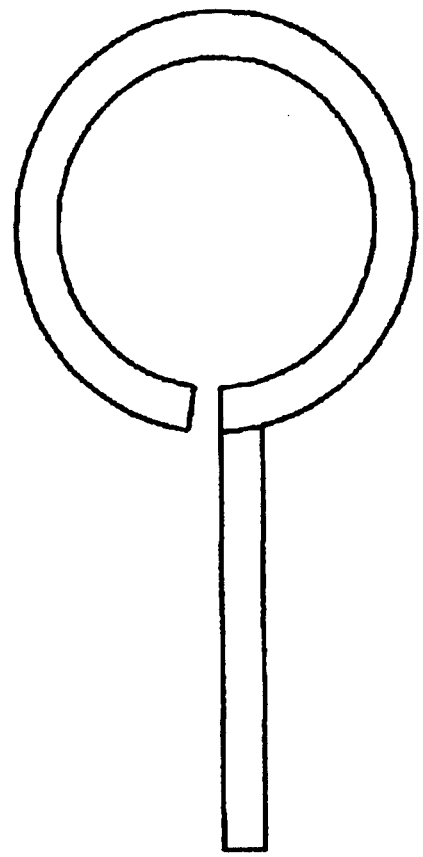
FIGS. 2a and 2b are top and side views of a ring-shaped conductor employed in the plasma sputtering apparatus of FIG. 1, respectively.
Figure 2B:
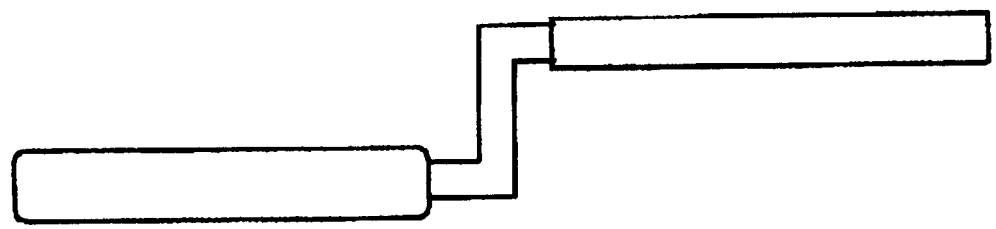

As shown in FIG. 2, the conductor 20 of the aforementioned embodiment of the present invention may be ring-shaped. With reference to FIG. 2, the ring-shaped conductor 20 is symmetrically formed and spaced from the substrate 11 and the target 14 by a designated distance so as to form a circular conductor area between the substrate 11 and the target 14 and to uniformly affect the substrate 11 and the target 14. Further, the ring-shaped conductor 20 is constructed so that the ions discharged from the target 14 proceed to the substrate 11 via the hole of the conductor 20.

The conductor 20 of the present invention is not limited to the ring shape. If a conductor uniformly affects the substrate 11 and has at least one hole formed therein so as to allow ions discharged from the target 14 to proceed to the substrate 11 under the sputtering condition, any conductor may be used. Instead of the ring-shaped conductor employed in the aforementioned embodiment of the present invention, a mesh-typed conductor including a plurality of holes uniformly arranged thereon may be alternatively used.

The conductor 20 disposed between the substrate 11 and the target 14 grounds electrons of plasma state and increases the density of positive ions (cations) of activation gas in plasma state, thereby achieving the same effect as the supply of high power. Therefore, oxygen is effectively decomposed so as to improve the bonding force with $Fe^{2+}$ and $Fe^{3+}$ ions discharged from the target 14.

The plasma sputtering apparatus may further comprise a conductor-side power supply unit 29 for supplying power to the conductor 20. The conductor-side power supply unit 29 applies power to the conductor 20, thereby supplying additional power and generating second plasma. Herein, the second plasma represents an additional plasma state formed separately from the plasma generated by the conventional power supply unit 29. In case the second plasma is generated by the conductor-side power supply unit 29, compared to the case without applying the conductor-side power to the conductor 20, higher energy is obtained so as to more effectively decompose oxygen gas into ions ($O^-$). Further, it is possible to control $Fe^{2+}$ and $Fe^{3+}$ ions with different bonding energies at the proper ratio by adjusting the additionally supplied conductor-side power to the conductor 20. Therefore, the supply of additional power to the conductor 20 using the conductor-side power supply unit 29 controls $Fe^{2+}$ and $Fe^{3+}$ ions to be discharged from the target 14 at the proper ratio, and generates oxygen ions decomposed from oxygen gas in large quantities, thereby forming a $Fe_3O_4$ magnetic thin film with the proper composition ratio. Instead of the ring-shaped conductor 20, other-shaped conductors also have the same effect. Compared to the ring-shaped conductor 20, in the case of a mesh-typed conductor having a plurality of uniformly arranged holes, power is more narrowly applied by plural holes.

The plasma sputtering apparatus of the present invention further comprises magnetic formation means 13. The magnetic formation means 13 forms a magnetic field with a coercive force at least larger than that of a magnetic thin film to be formed on the substrate 11, thereby improving a spin arrangement state of atoms of the magnetic thin film. Therefore, an easy-magnetization axis is formed on the magnetic thin film in a designated direction, thereby obtaining the magnetic thin film with an improved squareness ratio of its hysteresis loop.

As shown in FIG. 1, the target 14 of the plasma sputtering apparatus is made of Fe. Herein, a designated amount of oxygen gas, or a designated amount of oxygen gas and activation gas (for example, Ar gas), is injected into the reaction chamber 10, thereby forming a $Fe_3O_4$ thin film on the substrate 11.

The substrate holder 12 may comprise heating means 16 for heating the substrate 11 disposed on the substrate holder 12, or rotary means (not shown) for rotating the substrate 11. The heating means 16 is heated using a resistor being disposed within the substrate holder 12. Generally, as the substrate 11 is heated to higher temperatures, oxide crystals grown on the substrate 11 have more excellent properties. However, as described above, in case the substrate 11 is excessively heated, the magnetic oxide formed on the substrate 11 may lose its magnetic properties. Therefore, preferably, the heating means 16 is used only when the additional voltage is not applied to the conductor 20, and the temperature of the heated substrate 11 by the heating means 16 is maintained at approximately 100° C. to 400° C. The rotary means serves to rotate the substrate 11 for forming the thin film, thereby more uniformly forming the thin film on the substrate 11.

Further, the present invention provides a method for manufacturing a half-metallic oxide using a plasma sputtering apparatus.

In accordance with the method for manufacturing the half-metallic oxide, a conductor provided with at least one hole is disposed between a substrate holder and a metal target, and a magnetic field at an area where a thin film is formed on the substrate, with a coercive force larger than that of the thin film to be formed, is formed on the substrate. Then, oxygen gas is injected into the reaction chamber, and a designated voltage is applied to the reaction chamber so as to form a sputtering condition. A half-metallic magnetic oxide thin film on the substrate is formed on the substrate by bonding ions discharged from the metal target to oxygen ions decomposed from the oxygen gas under the sputtering condition of the reaction chamber.

Generally, as the gas injected into the reaction chamber, in addition to the reaction gas such as oxygen gas, activation gas such as Argon (Ar) gas may be additionally injected. The activation gas serves to increase the density of positive ions within the reaction chamber. Therefore, in order to obtain a $Fe_3O_4$ thin film with high density, it is preferable to inject Ar gas into the reaction chamber.

Hereinafter, the method for manufacturing a half-metallic oxide thin film in accordance with the preferred embodiment of the present invention will be described in detail. In this embodiment of the present invention, a method for manufacturing a $Fe_3O_4$ thin film being a representative one of half-metallic oxide thin films is described.

EXAMPLE 1

A substrate is arranged on a substrate holder in a reaction chamber of a conventional plasma sputtering apparatus, and a ring-shaped conductor is disposed between the substrate holder and a metal target. A magnetic field is formed at an area on the substrate where a thin film will be formed. Herein, the magnetic field has a coercive force at least larger than that of the thin film to be formed. In order to form the magnetic field, two permanent magnets with a strength of approximately 500 (Oe) are formed on both sides of the outer circumference of the substrate holder. The ring-shaped conductor is the same as that shown in FIG. 2. In order to manufacture a $Fe_3O_4$ thin film, a Fe target is used as the metal target.

Argon gas as the activation gas and oxygen gas as the reaction gas are respectively supplied into the reaction chamber of the plasma sputtering apparatus with the ring-shaped conductor disposed therein at the rate of approximately 30 sccm and approximately 0.8 sccm, thereby making the total pressure within the reaction chamber to be 2 mtorr. Then, power of approximately 60 W is supplied between the Fe target and the substrate holder, thereby generating first plasma as the reactive sputtering condition. Under this condition, in order to remove impurities attached to the target, the sputtering gun, etc., a pre-sputtering is carried out for 3 minutes.

Next, power with the same strength as that of the above step is continuously supplied between the Fe target and the substrate holder so as to manufacture the $Fe_3O_4$ thin film. Herein, power of 200 W is further supplied to the ring-shaped conductor, thereby generating second plasma.

The $Fe_3O_4$ obtained by applying an additional bias voltage to the ring-shaped conductor is analyzed by X-ray diffraction (XRD) and the resulted X-ray diffraction pattern is compared to that of a $Fe_3O_4$ bulk sample.

Figure 3A:
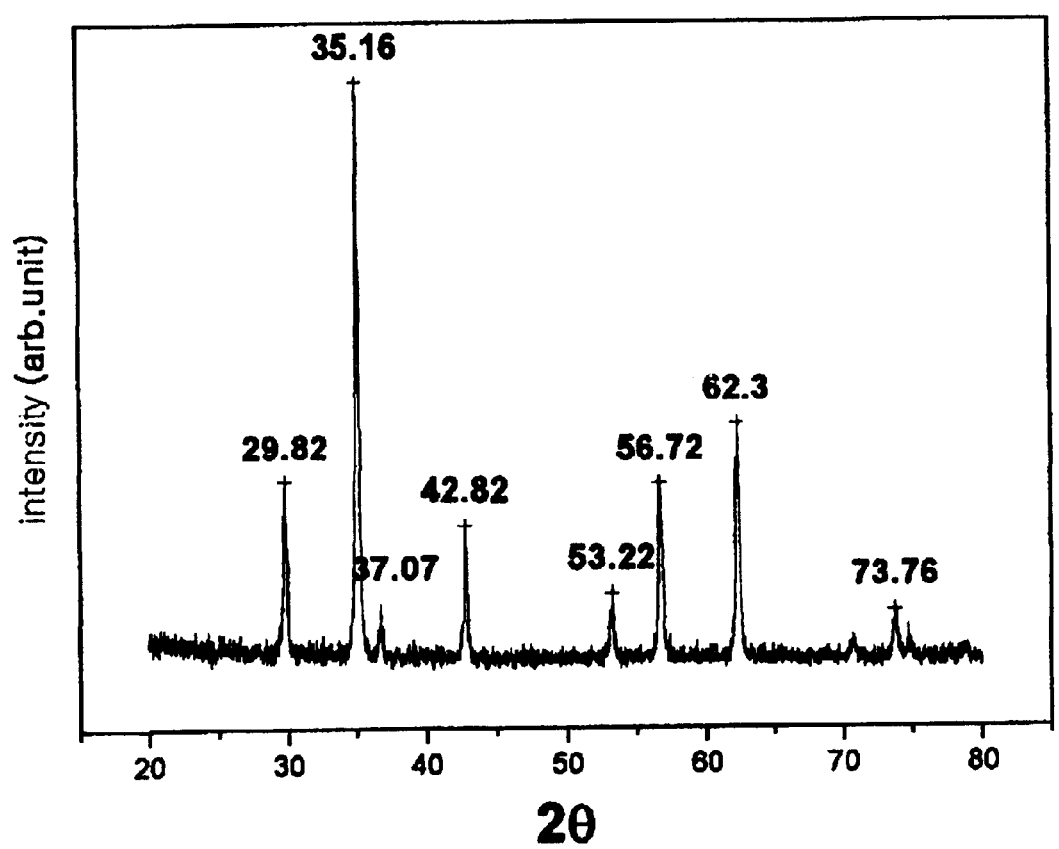
FIGS. 3a and 3b are graphs illustrating X-ray diffraction patterns of a conventional $Fe_3O_4$ bulk and a $Fe_3O_4$ thin film in accordance with an embodiment of the present invention, respectively.
Figure 3B:
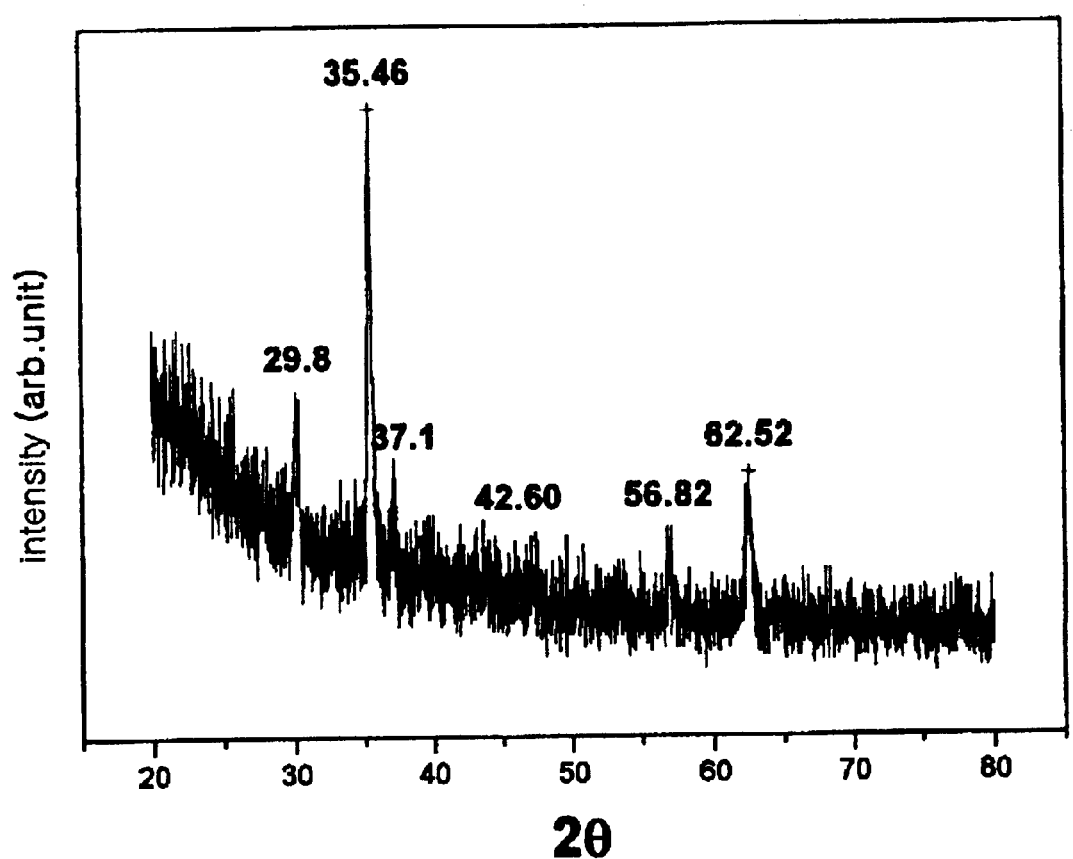

FIGS. 3a and 3b are graphs illustrating X-ray diffraction patterns of the conventional $Fe_3O_4$ bulk sample and the $Fe_3O_4$ thin film obtained in accordance with the example of the present invention, respectively. With reference to FIGS. 3a and 3b, two materials have peaks at similar angles (2Θ=29.8, 35, 37.1, 56.8, and 62). Since the $Fe_3O_4$ material obtained by this example of the present invention is not a bulk but a thin film, in consideration of the strain generated between diffraction gratings of the $Fe_3O_4$ thin film, it is appreciated that the relative sizes of the peaks in the two materials are almost the same and the thin film obtained by this example of the present invention is a $Fe_3O_4$ thin film.

Comparative Example

Figure 4:
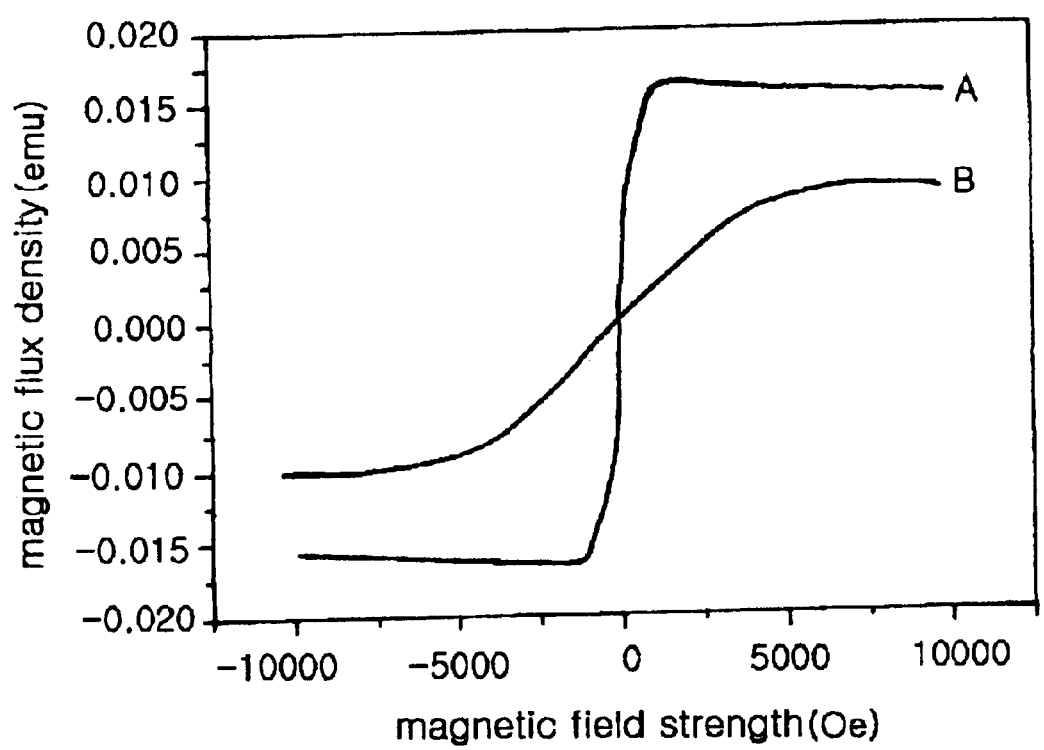
FIG. 4 is a graph of a magnetization curve illustrating the change of magnetic flux density according to the change of the strength of magnetic field in a method for manufacturing a half-metallic magnetic oxide in accordance with the present invention.

In the comparative example, a $Fe_3O_4$ thin film is formed under the same condition as that of the aforementioned first example except that a magnetic field is not formed on the substrate. In order to compare the thin film obtained by the comparative example to the thin film obtained by the first example in the aspects of magnetic properties, FIG. 4 is described. FIG. 4 is a graph of magnetization curves illustrating the change of magnetic flux density according to the change of the strength of magnetic field. In the graph shown in FIG. 4, a curve A is the magnetization curve of the thin film obtained by the example 1, and a curve B is the magnetization curve of the thin film obtained by the comparative example, in which the thin film is grown on the substrate without forming the magnetic field on the substrate. In case of the first example of the present invention, when the magnetic field orientation is converted, the value of the magnetic flux density is immediately changed from the positive to the negative, or from the negative to the positive. On the other hand, in case of the comparative example, when the magnetic field orientation is converted, the value of the magnetic flux density is gradually changed from the positive to the negative or from the negative to the positive.

That is, since the thin film obtained by the comparative example does not immediately achieve spin inversion of atoms of thin film, the thin film does not reach magnetic saturation in the range of −5,000 (Oe)~5,000 (Oe) and the magnetic flux density is merely changed by the conversion of the magnetic field orientation.

In case the magnetic field is not formed on the substrate in forming the thin film on the substrate, the spin arrangement state of atoms of the obtained thin film is poor, thereby not forming an easy-magnetization axis on the thin film. Thus, the absence of the easy-magnetization axis on the thin film causes the thin film not to reach magnetic saturation.

In order to improve the spin arrangement of the thin film, the formed magnetic field must have a coercive force larger than that of the thin film to be formed, and more preferably be in the range of 100 (Oe)~2 (KOe).

EXAMPLE 2

In the example 2 of the present invention, a $Fe_3O_4$ thin film is formed by changing the voltage applied to the conductor from the aforementioned example 1. That is, a voltage of approximately 250 W, being larger than that of the example 1 by 50 W, is supplied to the ring-shaped conductor.

In order to illustrate the effect of power supplied to the ring-shaped conductor, SEM photographs of the $Fe_3O_4$ thin film obtained by the example 1 and the $Fe_3O_4$ thin film obtained by the example 2 are examined.

Figure 5A:
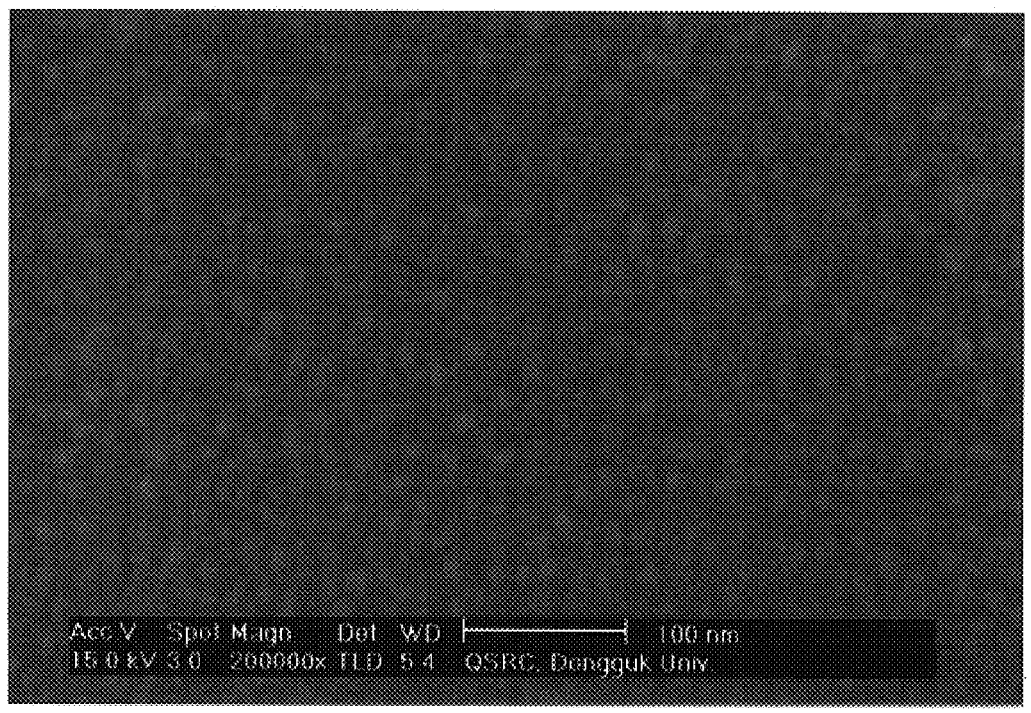
FIGS. 5a to 5d are SEM (Scanning Electron Microscope) photographs of $Fe_3O_4$ thin films obtained by applying different voltages to a conductor in accordance with an embodiment of the present invention.
Figure 5B:
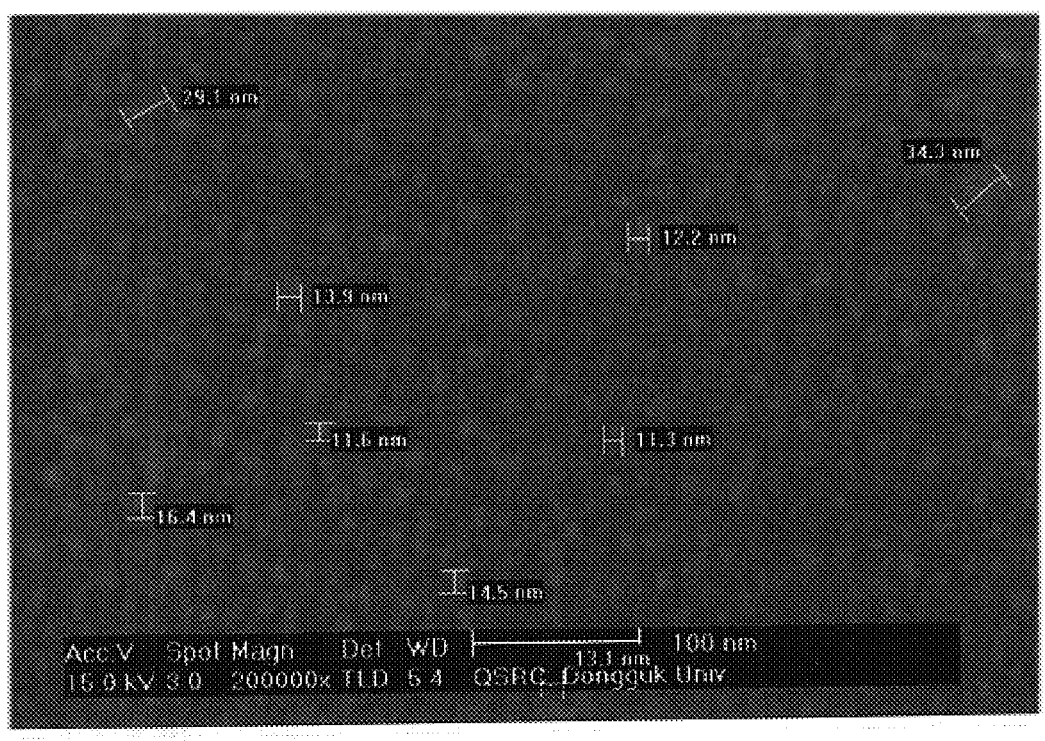
Figure 5C:
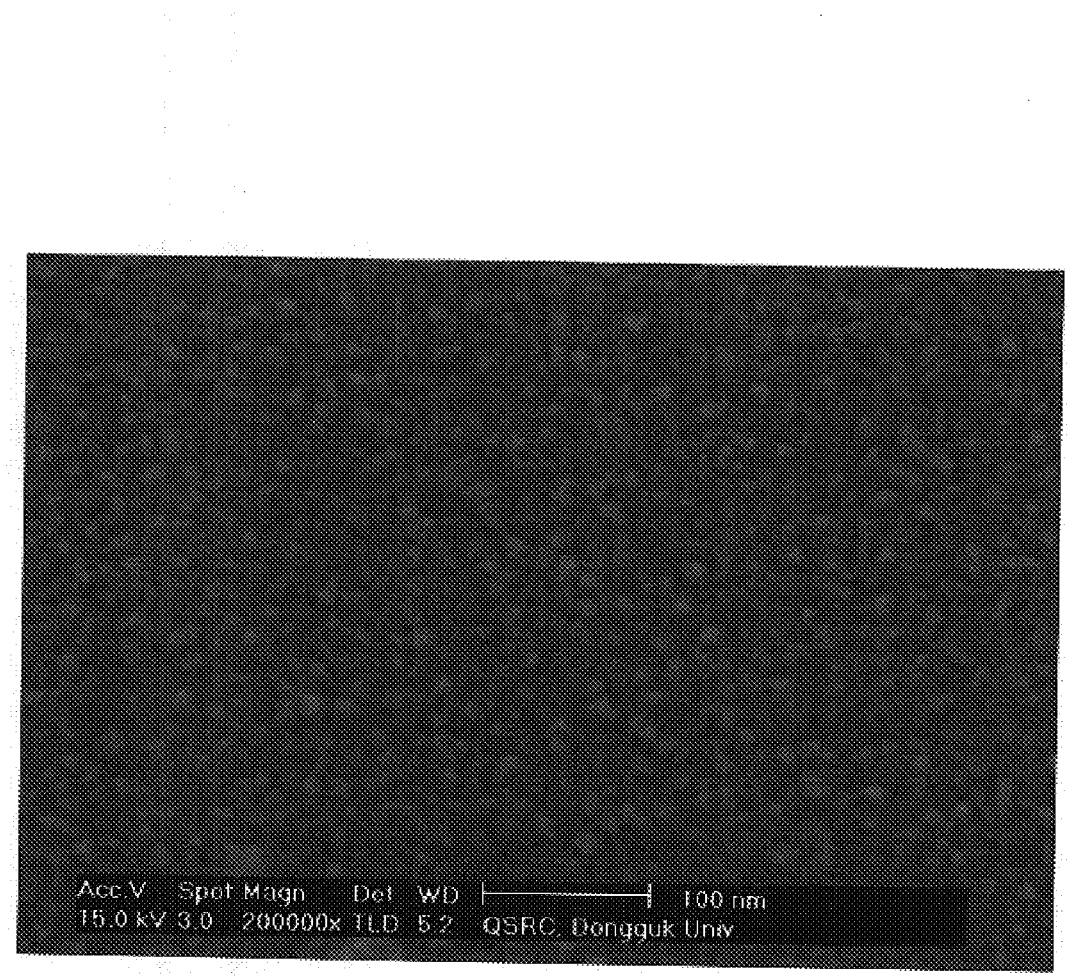
Figure 5D:
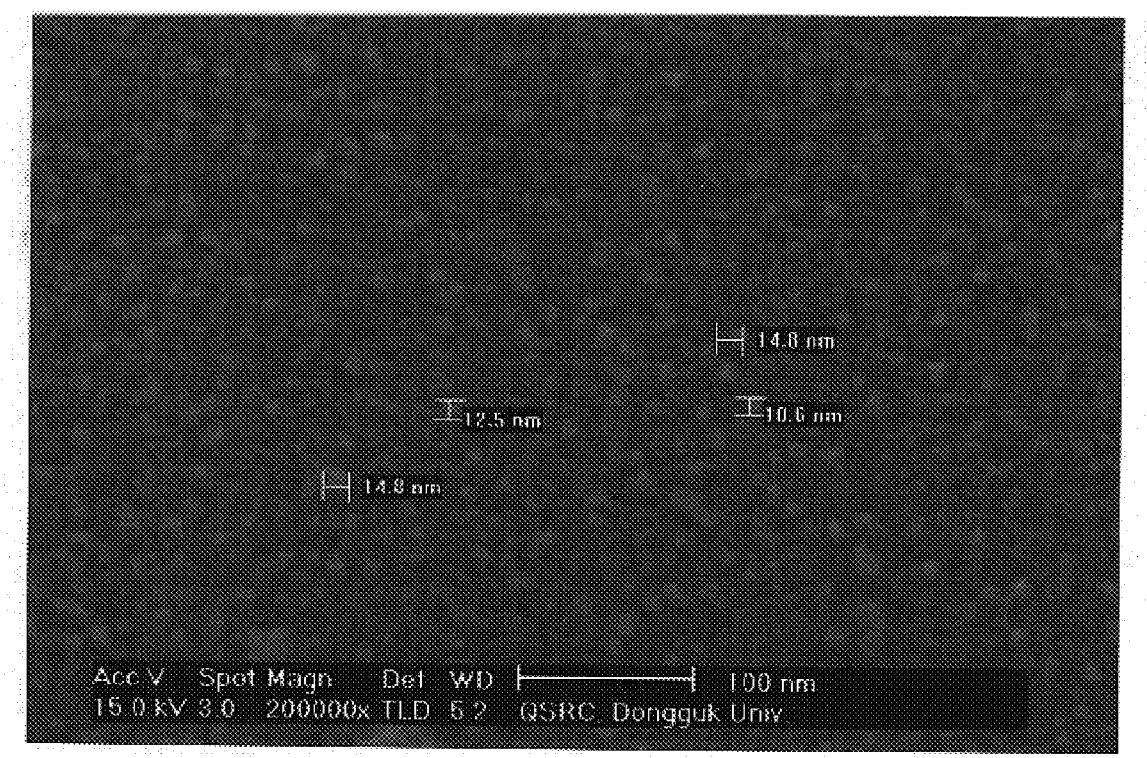

FIGS. 5a to 5d are SEM (Scanning Electron Microscope) photographs of $Fe_3O_4$ thin films obtained by the examples 1 and 2. Particularly, FIGS. 5b and 5d are SEC photographs with scale bars inserted to the SEC photographs of FIGS. 5a and 5c, respectively.

With reference to FIGS. 5a to 5d, both $Fe_3O_4$ thin films have nano-sized structures. However, as shown in FIGS. 5c and 5d, particles of the $Fe_3O_4$ thin film obtained in the example 2 appear finer under the high power than particles of the $Fe_3O_4$ thin film obtained in the example 1. Since the $Fe_3O_4$ thin films of the present invention have nano-sized structures, the $Fe_3O_4$ thin films of the present invention may be applied to a nanoscale spin device including a quantum dot layer.

EXAMPLE 3

In the example 3 of the present invention, a $Fe_3O_4$ thin film is manufactured under the same conditions as those of the example 1. However, four $Fe_3O_4$ thin films are manufactured by feeding oxygen gas at different flow rates of approximately 0.7 sccm, 0.9 sccm, 1.0 sccm, and 1.2 sccm.

Figure 6:
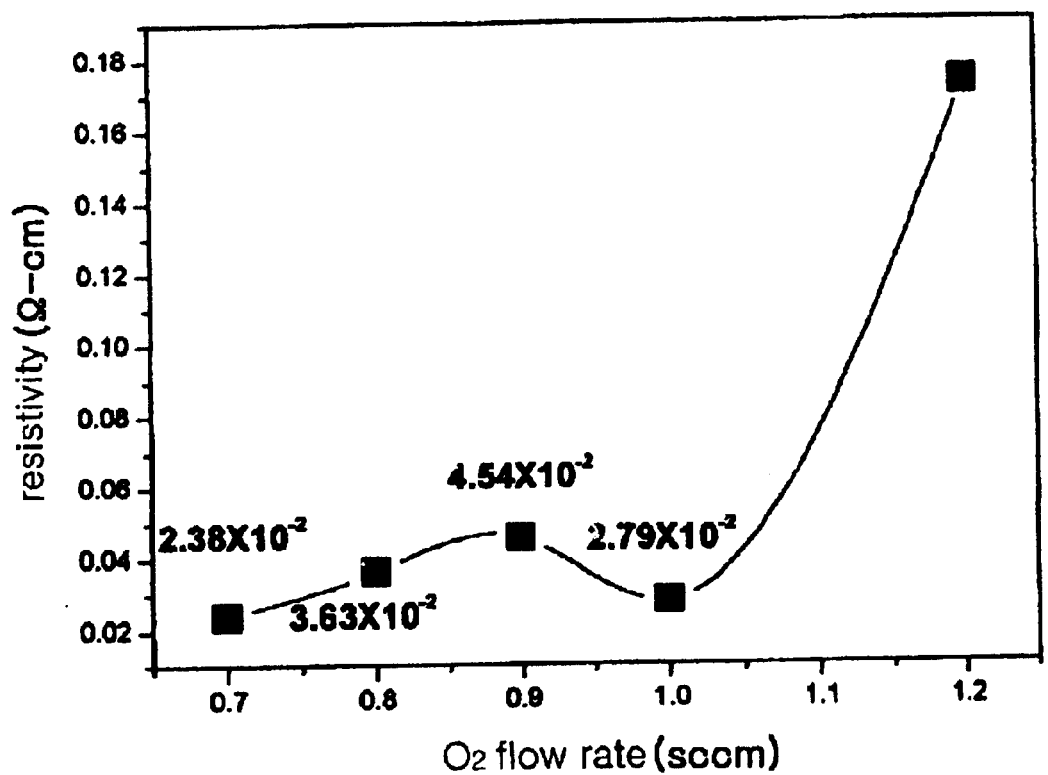
FIG. 6 is a graph illustrating the change of resistivities of $Fe_3O_4$ thin films obtained by varying the flow rate of oxygen gas in accordance with another embodiment of the present invention.

Resistivities ($\Omega \cdot cm$) of the four $Fe_3O_4$ thin films obtained by the example 3 of the present invention are measured. FIG. 6 is a graph showing resistivities of four $Fe_3O_4$ thin films obtained by the example 3 and the $Fe_3O_4$ thin film obtained by the example 1. The resistivity of the conventional $Fe_3O_4$ bulk sample is $4 \times 10^{-3} \Omega \cdot cm$, i.e., in the range of approximately $10^{-3} \Omega \cdot cm$ to $10^{-2} \Omega \cdot cm$. As shown in FIG. 6, the resistivities of the $Fe_3O_4$ thin films obtained by the example of the present invention are in the range of approximately $10^{-3} \Omega \cdot cm$. Since the $Fe_3O_4$ of the present invention is manufactured as a thin film type, it is considered that the resistivity of the $Fe_3O_4$ thin film of the present invention is increased by the strain between the diffraction gratings of the thin film. In this aspect, it is appreciated that the $Fe_3O_4$ thin film manufactured by the present invention has the precise electrical properties of $Fe_3O_4$.

As a result of this example, it is appreciated that the proper flow rate of oxygen gas to manufacture the $Fe_3O_4$ thin film is in the range of approximately 0.7 sccm to 1.0 sccm.

The method for manufacturing a half-metallic oxide thin film of the present invention may be achieved by other embodiments.

For example, in forming a half-metallic oxide thin film, a step for rotating the substrate holder at a constant speed may be added, thereby uniformly growing the thin film on the substrate.

Although the method for manufacturing a half-metallic oxide thin film of the present invention is carried out at room temperature, the method may further comprise a step of heating the substrate at a designated temperature, thereby forming a half-metallic oxide thin film having more excellent properties. In case the temperature of the substrate is less than approximately 100° C., the heating effect is not sufficient, and in case the temperature of the substrate is more than approximately 400° C., magnetic properties of other magnetic substances added to the thin film so as to form a specific device, may be lost. Further, since Curie temperature of the $Fe_3O_4$ thin film is 850K, it is preferable to maintain the temperature of the heated substrate in the range of approximately 100° C. to approximately 400° C.

As is apparent from the above description, the present invention provides a method for manufacturing a half-metallic magnetic oxide thin film and a plasma sputtering apparatus used in the method. In the method for manufacturing the half-metallic magnetic oxide thin film in accordance with the present invention, high power is supplied to decompose oxygen into oxygen ions and additional power is applied to discharge metal ions having different electro-equivalences in a precise ratio, thereby being effectively performed at low temperatures. Further, since a magnetic field is formed on the substrate in forming a thin film on the substrate, the spin arrangement of atoms of the formed magnetic thin film is improved and an easy-magnetization axis is formed, thereby obtaining a magnetic thin film being suitably used in a multi-layered thin film memory device.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a half-metallic magnetic oxide thin film on a substrate using a plasma sputtering apparatus provided with a substrate holder for supporting the substrate, a metal target being opposite to the substrate holder, a gas injection inlet for supplying oxygen gas into a reaction chamber, and a power supply unit for applying a voltage to the reaction chamber using the target and the substrate holder as both electrodes, said method comprising the steps of:

disposing a conductor provided with at least one hole between the substrate holder and the metal target;

forming a magnetic field at an area where a thin film is formed on the substrate, said magnetic field having a coercive force larger than that of the thin film to be formed;

injecting oxygen gas into the reaction chamber;

applying a designated voltage to the reaction chamber so as to form a sputtering condition; and forming a half-metallic magnetic oxide thin film on the substrate by bonding ions discharged from the metal target to oxygen ions decomposed from the oxygen gas under the sputtering condition of the reaction chamber.

2. The method as set forth in claim 1, wherein the metal target is made of iron (Fe), and the half-metallic magnetic oxide thin film formed on the substrate is a $Fe_3O_4$ thin film.

3. The method as set forth in claim 1, wherein the conductor is ring-shaped.

4. The method as set forth in claim 1, wherein the conductor is formed as a mesh including a plurality of holes uniformly arranged thereon.

5. The method as set forth in claim 1, wherein the magnetic field formed on the substrate has a strength of more than 100 Oe.

6. The method as set forth in claim 5, wherein the magnetic field formed on the substrate has a strength between 100 Oe and 2 kOe.

7. The method as set forth in claim 1, wherein the step of injecting oxygen gas further comprises the step of injecting activation gas into the reaction chamber.

8. The method as set forth in claim 7, wherein the activation gas is Argon (Ar) gas.

9. The method as set forth in claim 8, wherein the flow rate of Argon (Ar) gas injected into the reaction chamber is approximately 10 sccm to 50 sccm.

10. The method as set forth in claim 7, wherein the flow rate of oxygen gas injected into the reaction chamber is approximately 0.1 sccm to 10 sccm.

11. The method as set forth in claim 1, wherein the flow rate of oxygen gas injected into the reaction chamber is approximately 0.1 sccm to 10 sccm.

12. The method as set forth in claim 1, wherein the step of forming the reactive sputtering condition further comprises the step of applying a designated voltage to the conductor.

13. The method as set forth in claim 1, wherein the step of forming the half-metallic magnetic oxide thin film further comprises the step of rotating the substrate holder at a designated speed.

14. The method as set forth in claim 1, further comprising the step of heating the substrate at a designated temperature.

15. The method as set forth in claim 14, wherein the temperature of the heated substrate is approximately 100° C. to 400° C.

16. A plasma sputtering apparatus comprising:

reaction chamber;

a substrate holder formed on a side of the reaction chamber and serving to arrange a substrate thereon;

a gas injection inlet for supplying reaction gas into the reaction chamber;

a target being opposite to the substrate and serving to discharge its particles by the designated sputtering in the reaction chamber;

a power supply unit for supplying power for generating discharge between the substrate holder and the target;

a conductor disposed between the target and the substrate holder and provided with at least one hole for allowing the particles discharged from the target to proceed to the substrate; and magnetic formation means for forming a magnetic field on the substrate disposed on the substrate holder, said magnetic field having a coercive force larger than that of a thin film to be formed on the substrate.

17. The plasma sputtering apparatus as set forth in claim 16, wherein the magnetic formation means is disposed on the outer circumference of the substrate holder or the outer circumference of the substrate on the substrate holder.

18. The plasma sputtering apparatus as set forth in claim 16, further comprising a conductor-side power supply unit being connected to the conductor so as to apply a designated voltage to the conductor.

* * * * *

UNITED STATES PATENT AND TRADEMARK OFFICE
CERTIFICATE OF CORRECTION

PATENT NO. : 6,802,949 B2
DATED : October 12, 2004
INVENTOR(S) : Hong et al.

It is certified that error appears in the above-identified patent and that said Letters Patent is hereby corrected as shown below:

Column 10,
Line 5, "reaction chamber;" should read -- a reaction chamber; --

Signed and Sealed this

Tenth Day of May, 2005

JON W. DUDAS
*Director of the United States Patent and Trademark Office*